United States Patent
Zang et al.

(10) Patent No.: US 9,478,625 B1
(45) Date of Patent: Oct. 25, 2016

(54) METAL RESISTOR USING FINFET-BASED REPLACEMENT GATE PROCESS

(71) Applicant: GLOBALFOUNDRIES Inc., Grand Caymay (KY)

(72) Inventors: Hui Zang, Guilderland, NY (US); Min-hwa Chi, Malta, NY (US); Huang Liu, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/878,440

(22) Filed: Oct. 8, 2015

(51) Int. Cl.

| | |
|---|---|
| *H01L 21/00* | (2006.01) |
| *H01L 21/84* | (2006.01) |
| *H01L 27/01* | (2006.01) |
| *H01L 27/12* | (2006.01) |
| *H01L 31/0392* | (2006.01) |
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/43* | (2006.01) |
| *H01L 21/8234* | (2006.01) |
| *H01L 21/324* | (2006.01) |
| *H01L 21/265* | (2006.01) |
| *H01L 29/66* | (2006.01) |
| *H01L 27/088* | (2006.01) |

(52) U.S. Cl.
CPC ............ *H01L 29/435* (2013.01); *H01L 21/265* (2013.01); *H01L 21/324* (2013.01); *H01L 21/823431* (2013.01); *H01L 21/823443* (2013.01); *H01L 27/0886* (2013.01); *H01L 29/66545* (2013.01)

(58) Field of Classification Search
CPC .................... H01L 29/435; H01L 21/823431; H01L 21/823443; H01L 21/324
USPC .................. 257/350, 364; 438/155
See application file for complete search history.

(56) References Cited

U.S. PATENT DOCUMENTS

| | | | |
|---|---|---|---|
| 8,816,327 B2 | 8/2014 | Chang et al. | |
| 8,816,436 B2 | 8/2014 | Cheng et al. | |
| 2016/0020148 A1* | 1/2016 | Song | H01L 27/0629 438/238 |
| 2016/0172356 A1* | 6/2016 | Cheng | H01L 27/0629 257/379 |

* cited by examiner

*Primary Examiner* — David S Blum
(74) *Attorney, Agent, or Firm* — Wayne F. Reinke; Heslin Rothenberg Farley & Mesiti P.C.

(57) ABSTRACT

A semiconductor structure includes a semiconductor substrate, fins coupled to the substrate and surrounded at a bottom portion thereof by isolation material, and resistor(s) situated in the gate region(s), the gate regions being filled with undoped dummy gate material. As part of a replacement gate process, the resistor(s) are realized by forming silicide over dummy gate material, i.e., the dummy gate material for the resistor(s) is not removed.

20 Claims, 20 Drawing Sheets

METAL RESISTOR USING FINFET-BASED REPLACEMENT GATE PROCESS

BACKGROUND OF THE INVENTION

1. Technical Field

The present invention generally relates to resistors for semiconductor devices. More particularly, the present invention relates to resistors situated in a gate region of a three-dimensional transistor.

2. Background Information

In the design of semiconductor devices, metal resistors play an important role as a passive device. Doped polysilicon gates have recently been used as resistors. However, the doping makes such gates conductive, reducing their resistance. In FinFET technology, metal resistors are typically fabricated in a separate layer above the semiconductor device, which adds process complexity with extra steps and reduces the margins for later contact formation.

Therefore, a need continues to exist for resistors in semiconductor fabrication with reduced complexity that does not reduce contact margins.

SUMMARY OF THE INVENTION

The shortcomings of the prior art are overcome and additional advantages are provided through the provision, in one aspect, of a method of fabricating resistors for semiconductor devices. The method includes providing, as part of a replacement gate process, a starting semiconductor structure, the structure including a semiconductor substrate, a plurality of fins coupled to the substrate, and at least one gate region encompassing a portion of at least some of the plurality of fins, the at least one gate region being defined by a pair of spacers. The method further includes forming at least one resistor in one or more of the at least one gate region, the one or more of the at least one gate region being filled with undoped dummy gate material.

In accordance with another aspect, a semiconductor structure is provided. The semiconductor structure includes a semiconductor substrate, a plurality of fins coupled to the substrate and surrounded at a bottom portion thereof by isolation material, and at least one gate region surrounding a portion of at least one of the plurality of fins. The semiconductor structure further includes at least one resistor situated in one or more of the at least one gate region, the one or more of the at least one gate region being filled with undoped dummy gate material.

These, and other objects, features and advantages of this invention will become apparent from the following detailed description of the various aspects of the invention taken in conjunction with the accompanying drawings.

DETAILED DESCRIPTION OF THE INVENTION

Figure 1:
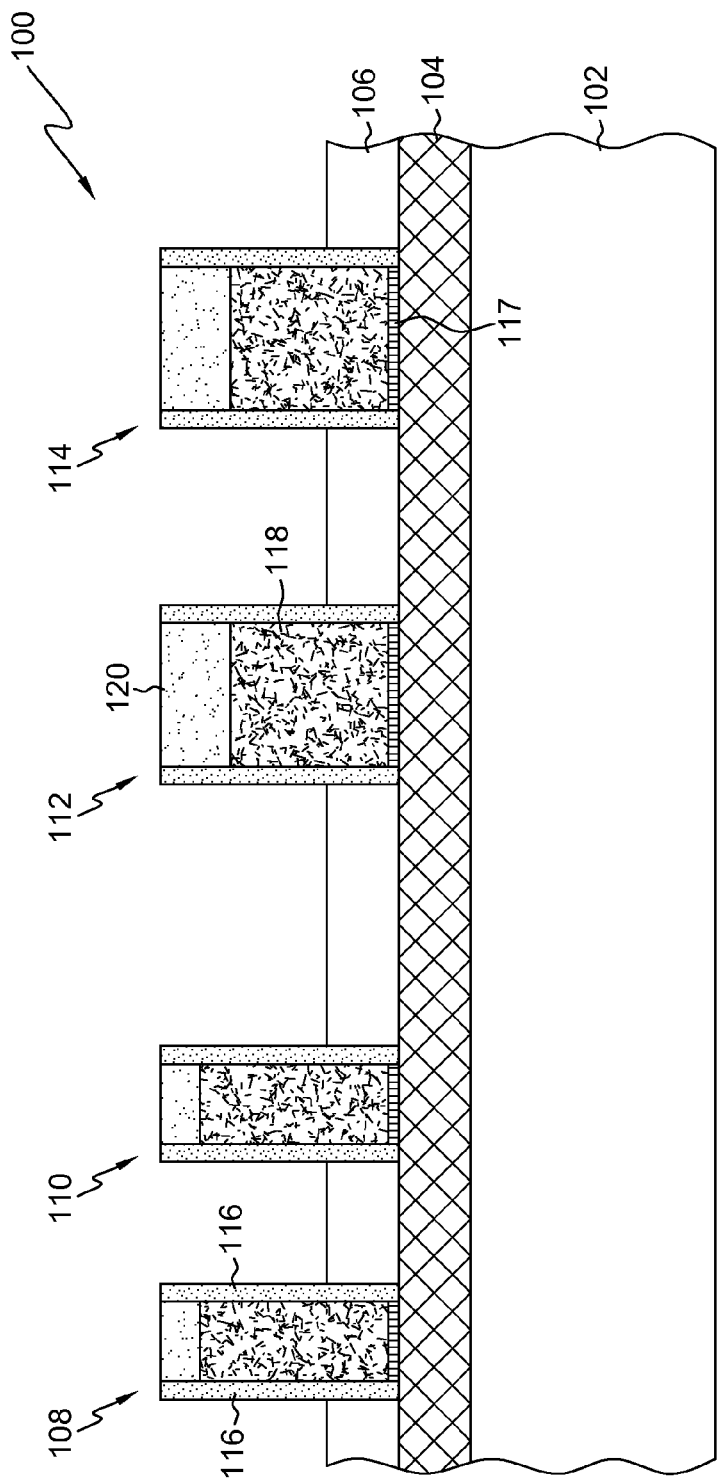
FIG. 1 is a cross-sectional view of one example of a starting semiconductor structure, the structure including a semiconductor substrate with an insulator layer thereover and a second semiconductor layer, the structure further including dummy gate structures, each dummy gate structure having a thin layer of oxide below dummy gate material and being enclosed by spacers and including an undoped dummy gate material and a gate cap, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus three percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

FIG. 1 is a cross-sectional view of one example of a starting semiconductor structure 100, the structure including a semiconductor substrate 102 with an insulator layer 104 thereover and a second semiconductor layer 106, the structure further including dummy gate structures 108, 110, 112 and 114, each dummy gate structure having a thin layer of oxide (e.g., about 2 nm to about 10 nm of silicon dioxide) below dummy gate material 118 (e.g., polysilicon or amorphous silicon) and enclosed by spacers (e.g., spacers 116 enclosing gate structure 108) and gate cap 120, the dummy gate material being undoped for use, in part, as an insulator, in accordance with one or more aspects of the present invention. Although not shown in FIG. 1 for clarity, it will be understood that source/drain regions on both sides of the dummy gate structure may have, for example, epitaxial semiconductor material (e.g., by growth) at a top thereof.

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
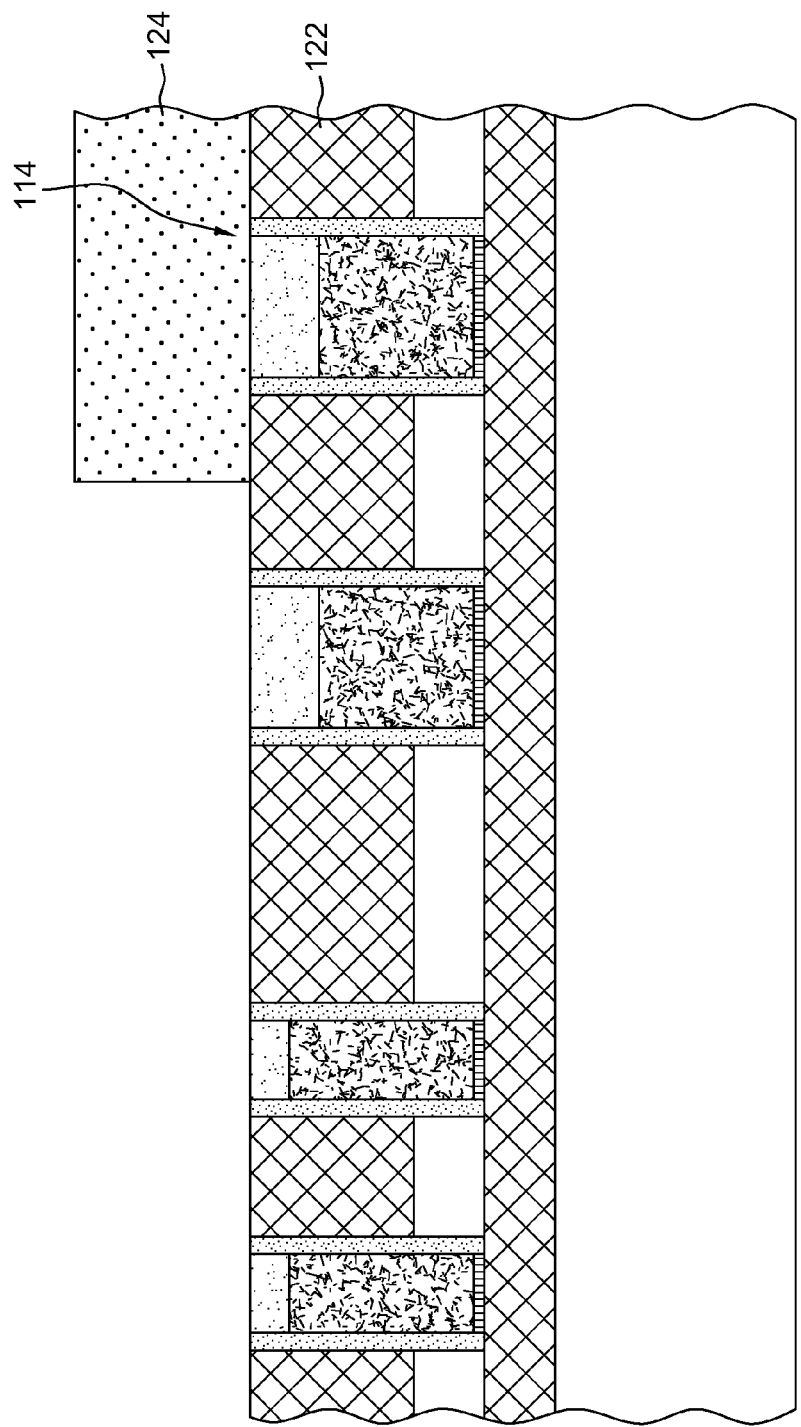
FIG. 2 depicts one example of the starting structure of FIG. 1 after filling in between the gate structures with an insulator material and a protective oxide layer (e.g., photo-resist) over one of the gate structures, in accordance with one or more aspects of the present invention.

FIG. 2 depicts one example of the starting structure of FIG. 1 after filling in between the gate structures with an insulator material 122 (e.g., by a deposition process) and forming a protective oxide layer 124 (e.g., photoresist) over gate structure 114, in accordance with one or more aspects of the present invention.

Figure 3:
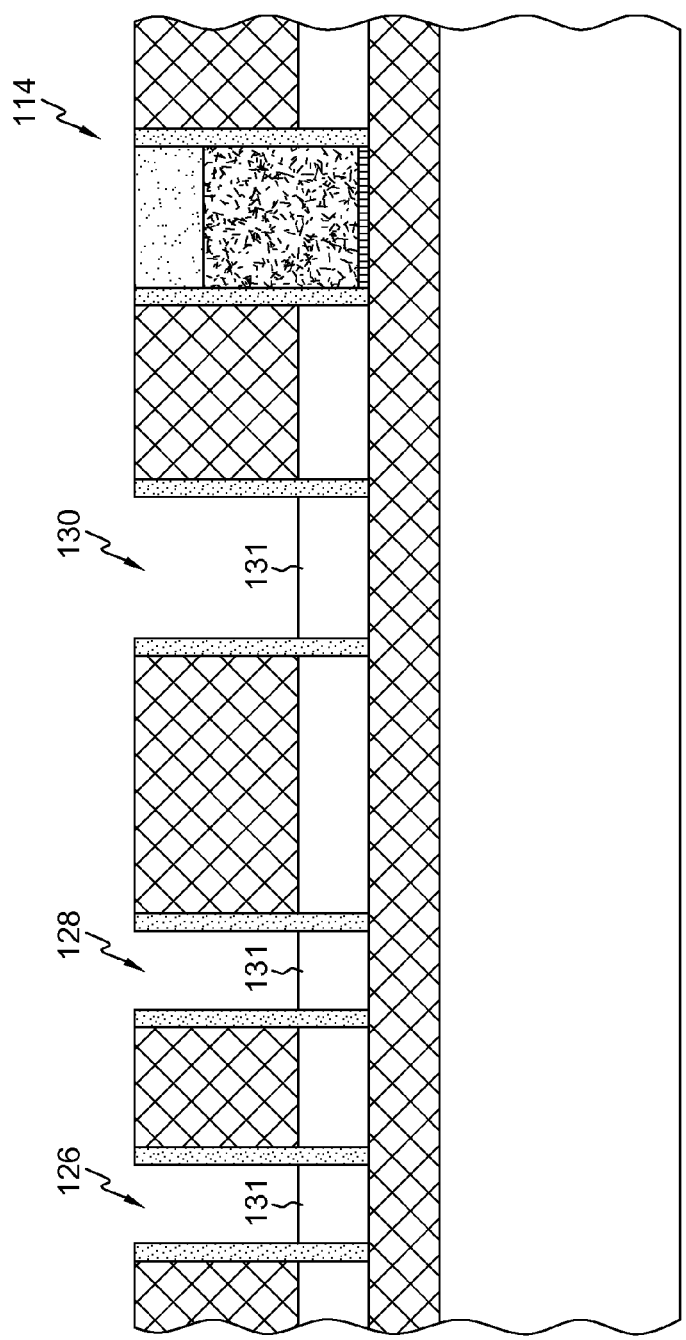
FIG. 3 depicts one example of the structure of FIG. 2 after removing the cap and dummy gate material, leaving openings, and revealing a fin, then removing the protective layer above the one gate structure, in accordance with one or more aspects of the present invention.

FIG. 3 depicts one example of the structure of FIG. 2 after removing gate cap 120 and dummy gate material (118, FIG. 1), leaving openings 126, 128 and 130, and revealing a fin 131, then removing the protective layer (124, FIG. 2) above gate structure 114, in accordance with one or more aspects of the present invention.

Figure 4:
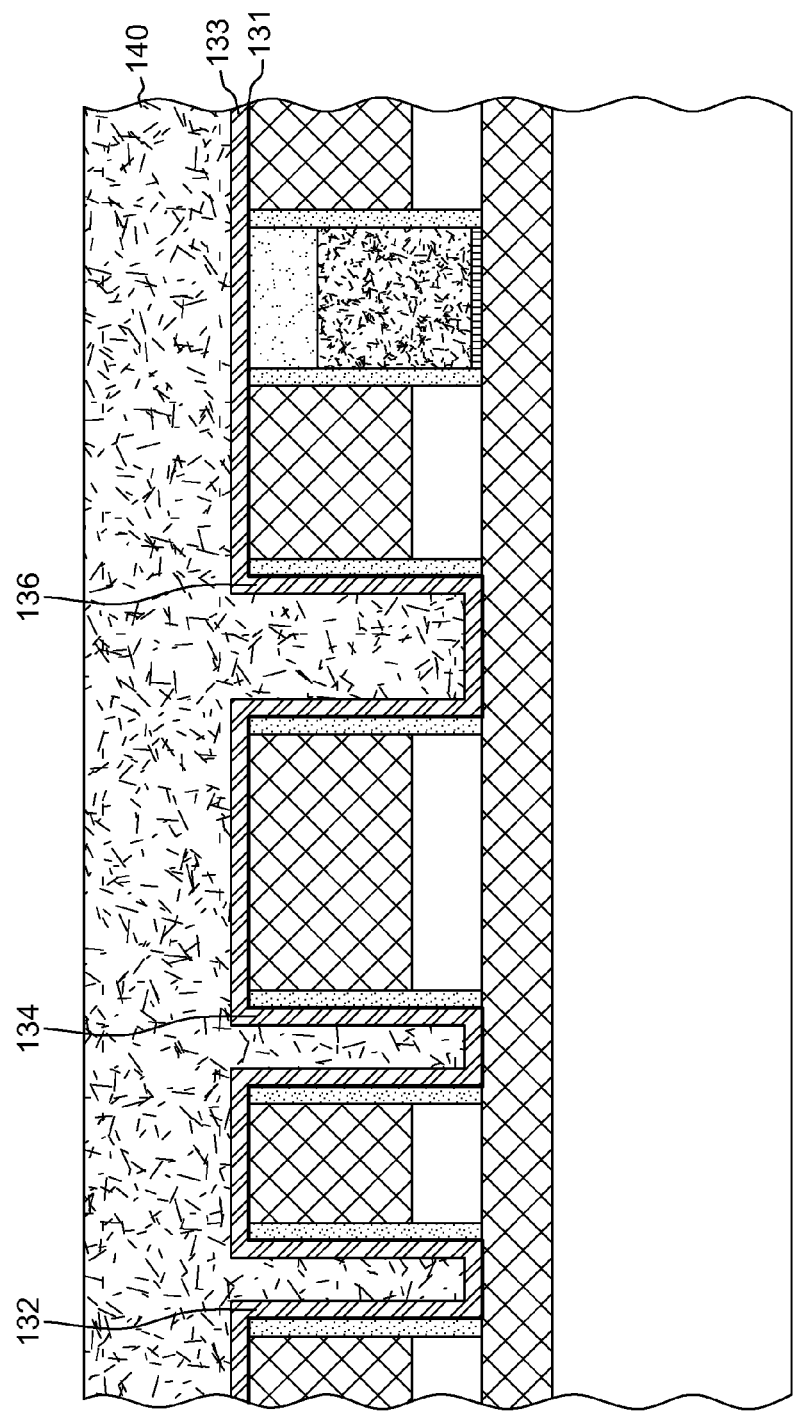
FIG. 4 depicts one example of the structure of FIG. 3 after forming a thin blanket layer of dielectric material (e.g., high-k) and a liner material over the dielectric material, as well as any work-function material, then over filling the openings with a conductive metal (e.g., tungsten), in accordance with one or more aspects of the present invention.

FIG. 4 depicts one example of the structure of FIG. 3 after forming a thin, conformable dielectric layer 131 (e.g., high-k dielectric-dielectric constant of or above 3.9) and a conformable liner layer 133 over the dielectric layer, for example, titanium and/or titanium nitride, and any work-function material, then over filling the openings with a conductive metal 140 (e.g., tungsten), in accordance with one or more aspects of the present invention.

Figure 5:
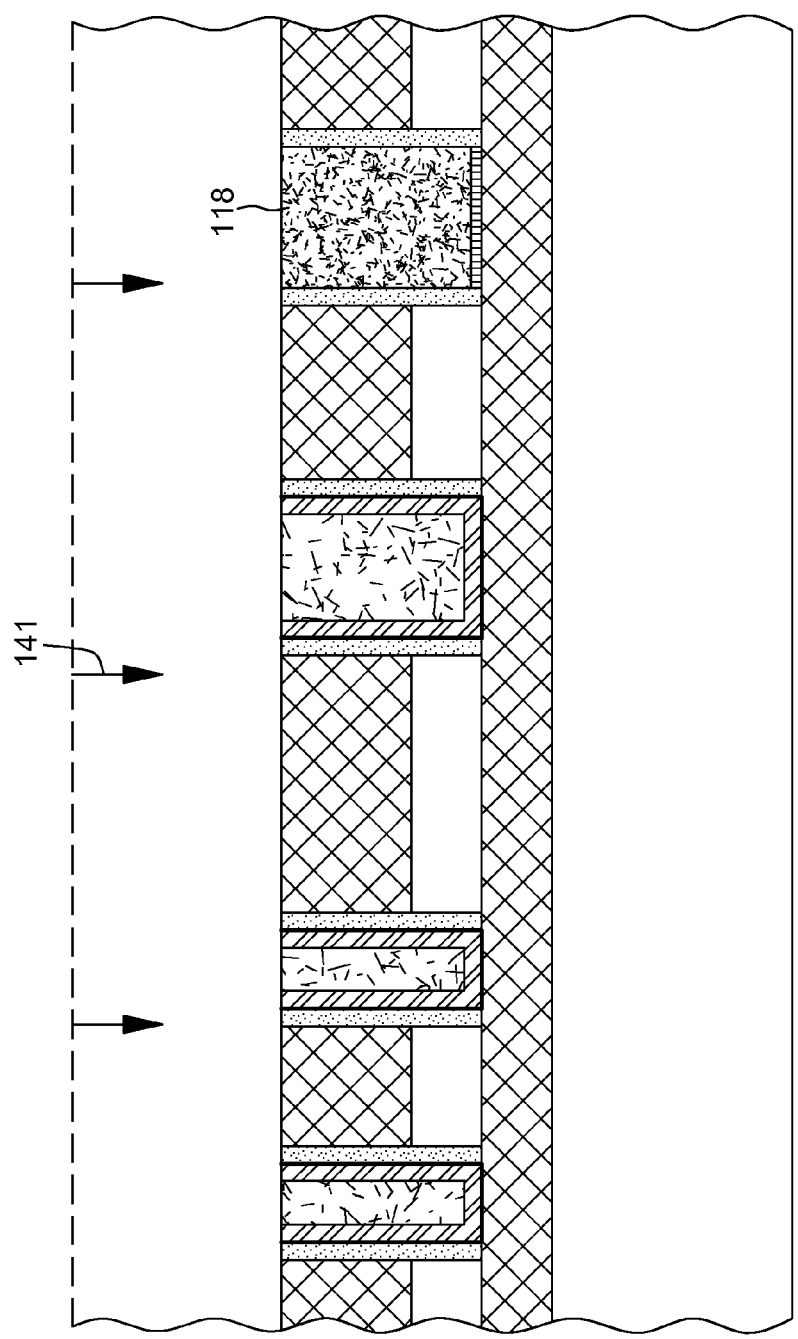
FIG. 5 depicts one example of the structure of FIG. 4 after planarizing down to the dummy gate material, in accordance with one or more aspects of the present invention.

FIG. 5 depicts one example of the structure of FIG. 4 after planarizing 141 down to the dummy gate material 118, in accordance with one or more aspects of the present invention.

Figure 6:
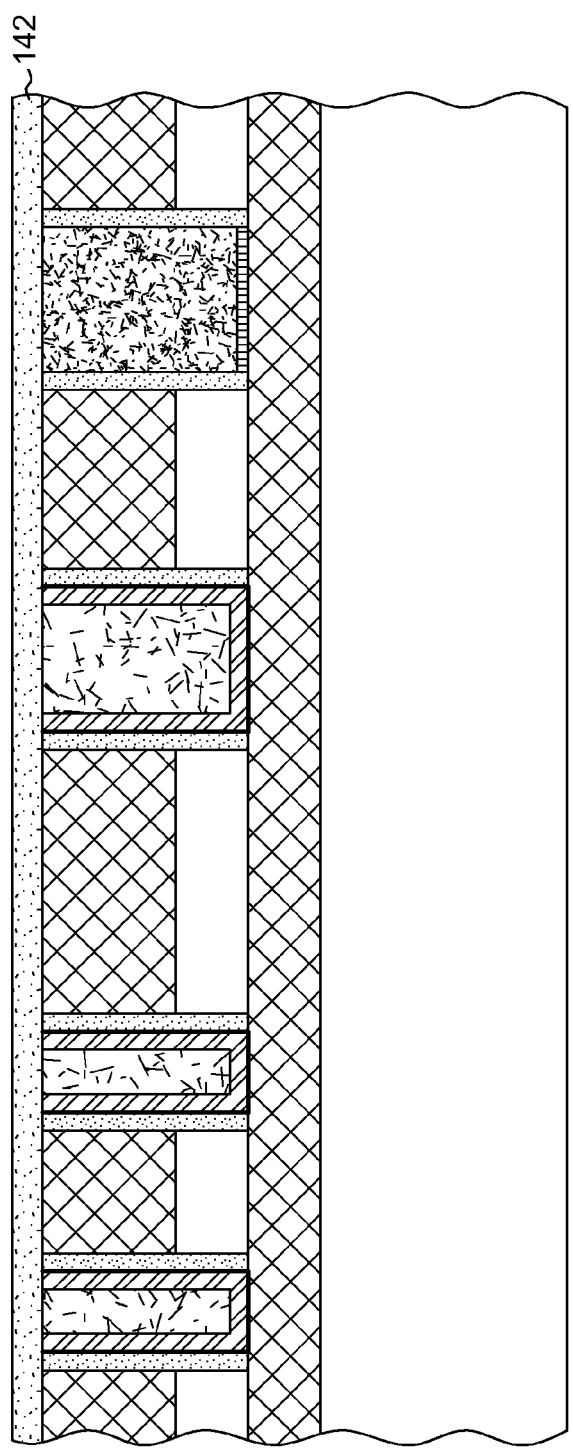
FIG. 6 depicts one example of the structure of FIG. 5 after forming a thin layer of silicidable metal (e.g., nickel, cobalt or titanium), in accordance with one or more aspects of the present invention.

FIG. 6 depicts one example of the structure of FIG. 5 after forming a thin (e.g., about 1 nm to about 10 nm) layer of silicidable metal 142 (e.g., nickel, cobalt or titanium), in accordance with one or more aspects of the present invention.

Figure 7:
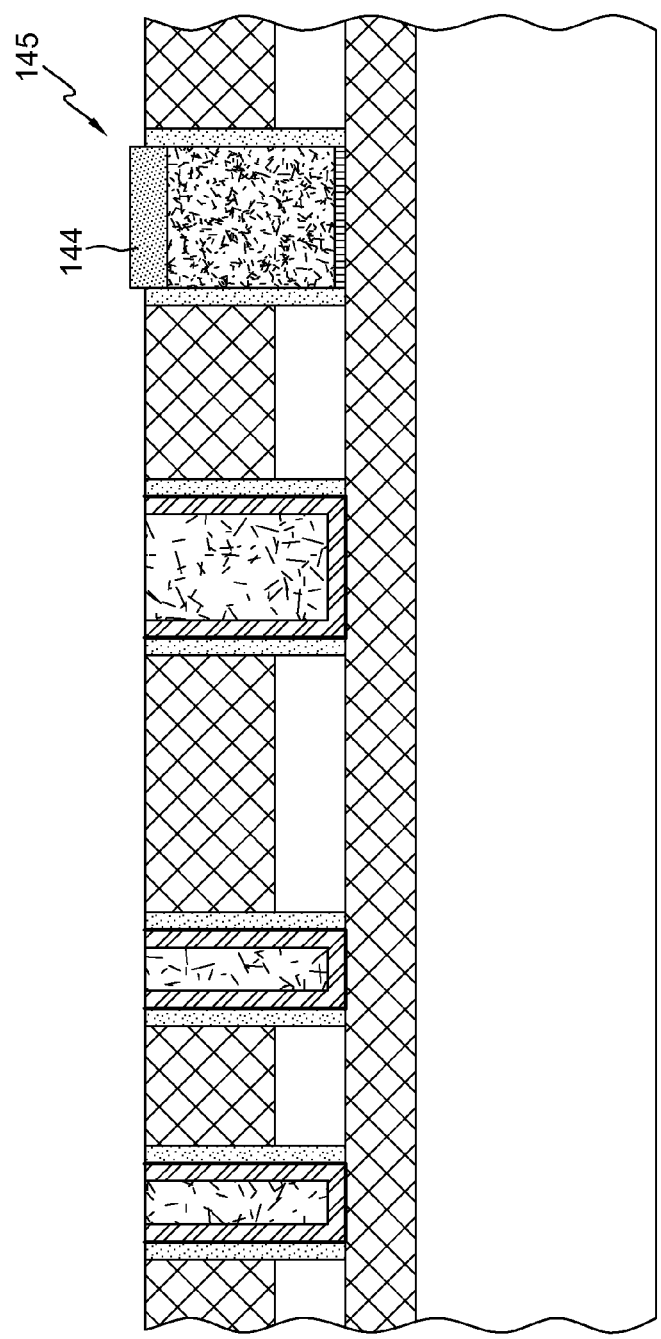
FIG. 7 depicts one example of the structure of FIG. 6 after annealing to form silicide and removing the unreacted metal, leaving silicide on the dummy gate, resulting in a resistor, in accordance with one or more aspects of the present invention.

FIG. 7 depicts one example of the structure of FIG. 6 after annealing to form silicide 144, resulting in a resistor 145, and removing the unreacted metal (142, FIG. 6) (e.g., using a wet etching process selective to the silicide), in accordance with one or more aspects of the present invention.

Figure 8:
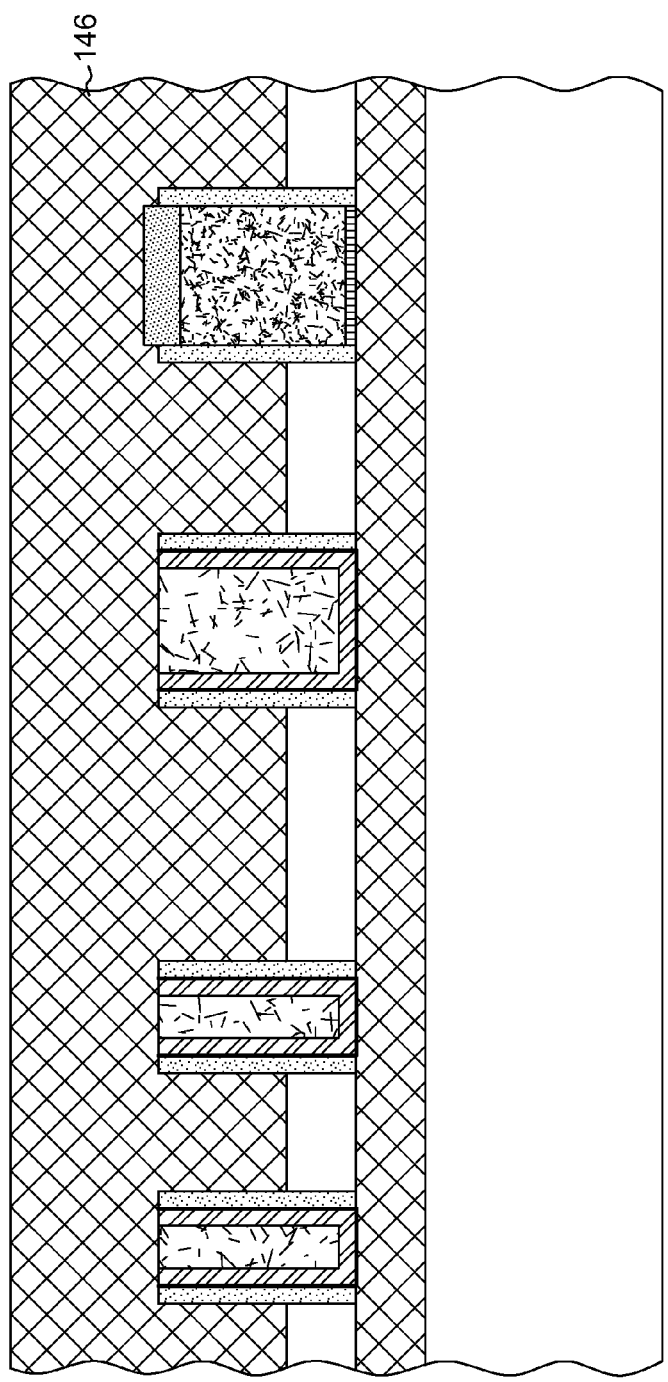
FIG. 8 depicts one example of the structure of FIG. 7 after forming a blanket conformal dielectric layer over the structure, in accordance with one or more aspects of the present invention.

FIG. 8 depicts one example of the structure of FIG. 7 after forming a blanket conformal dielectric layer 146 (e.g., an inter-layer dielectric by deposition) over the structure, in accordance with one or more aspects of the present invention.

Figure 9:
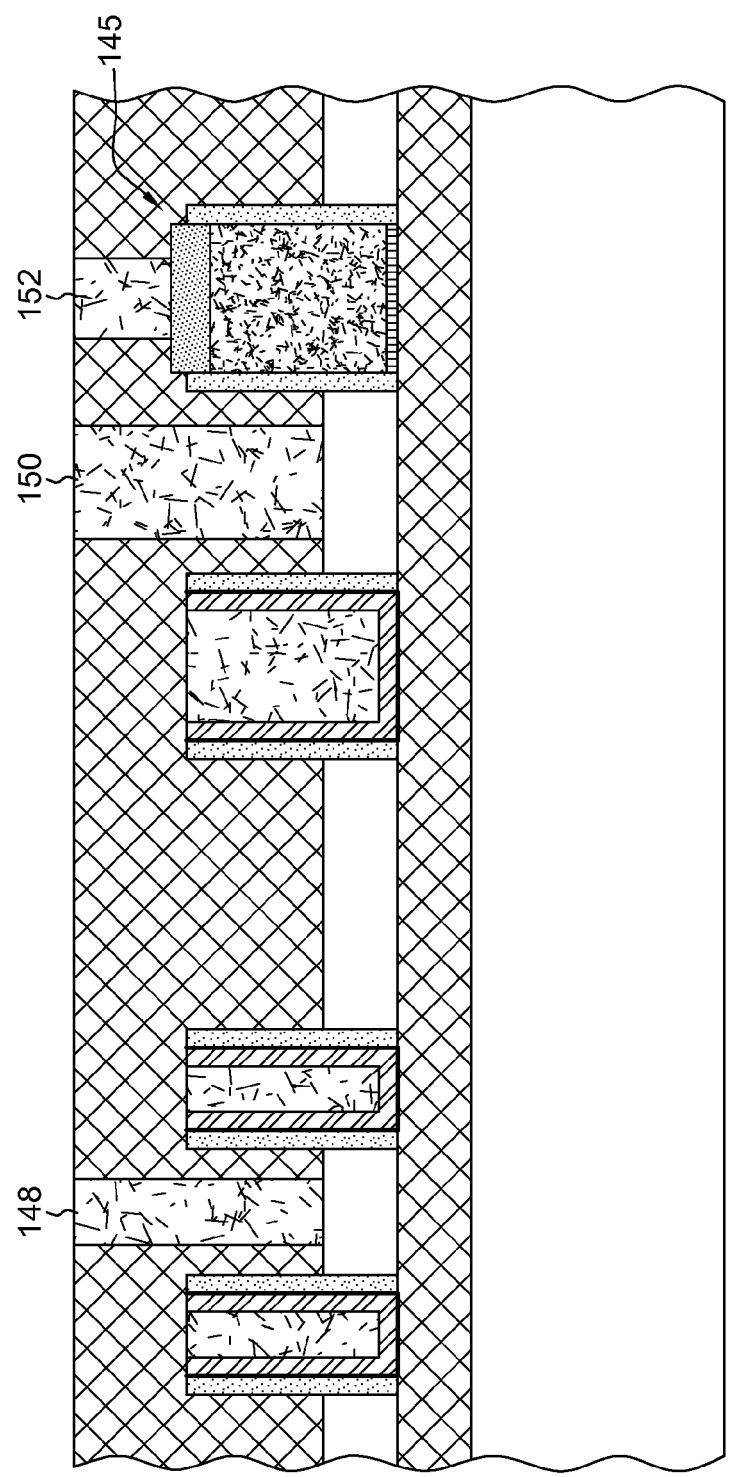
FIG. 9 depicts one example of the structure of FIG. 8 after forming contacts to the sources/drains and a contact to the resistor, in accordance with one or more aspects of the present invention.

FIG. 9 depicts one example of the structure of FIG. 8 after forming contacts 148 and 150 to the sources/drains and a contact 152 to resistor 145, in accordance with one or more aspects of the present invention.

Figure 10:
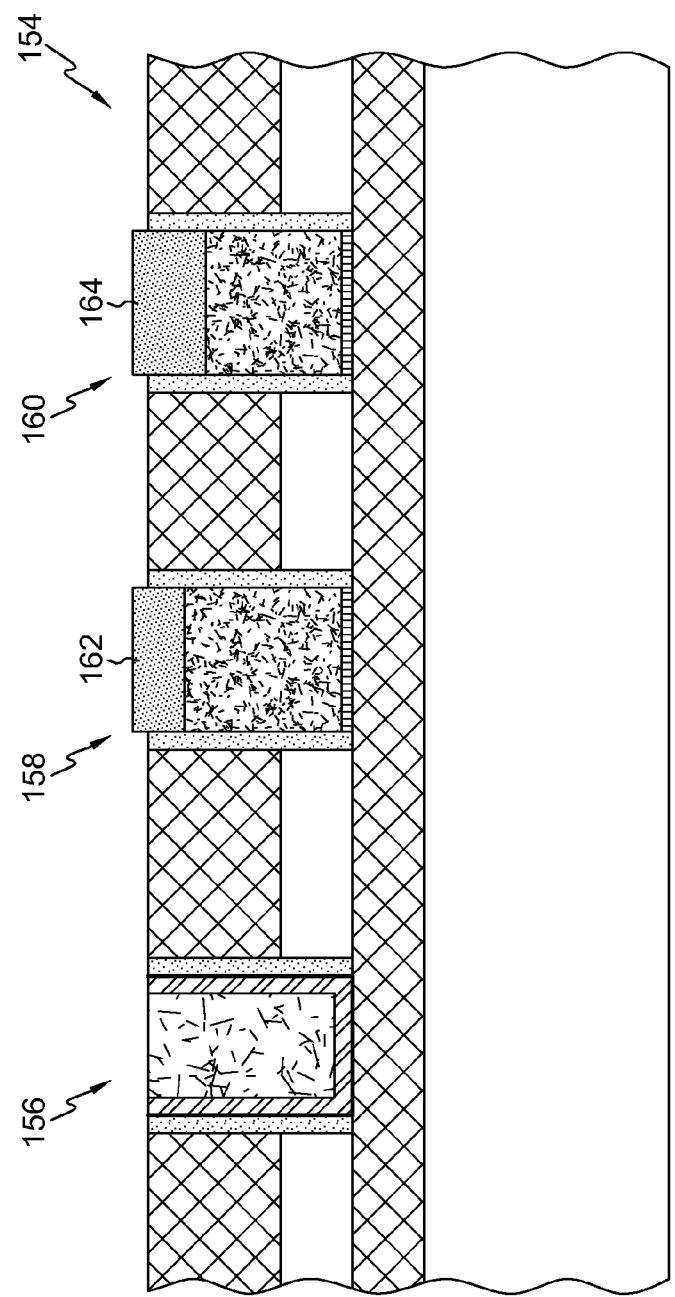
FIG. 10 is another example of a resistor structure co-fabricated with a semiconductor device(s), the structure including two resistors, each of the resistors having a different thickness of silicide, resulting in different resistance values, in accordance with one or more aspects of the present invention.

FIG. 10 is another example of a resistor structure 154 co-fabricated with a semiconductor device(s) (e.g., device 156), the structure including two resistors 158 and 160, each having a different thickness of silicide 162 and 164, resulting in different resistance values, for example, by selective removal of the metal via an additional masking/lithography process and anneal, in accordance with one or more aspects of the present invention. Although the silicides are different thicknesses in this example, it will be understood that they could have the same thickness.

Figure 11:
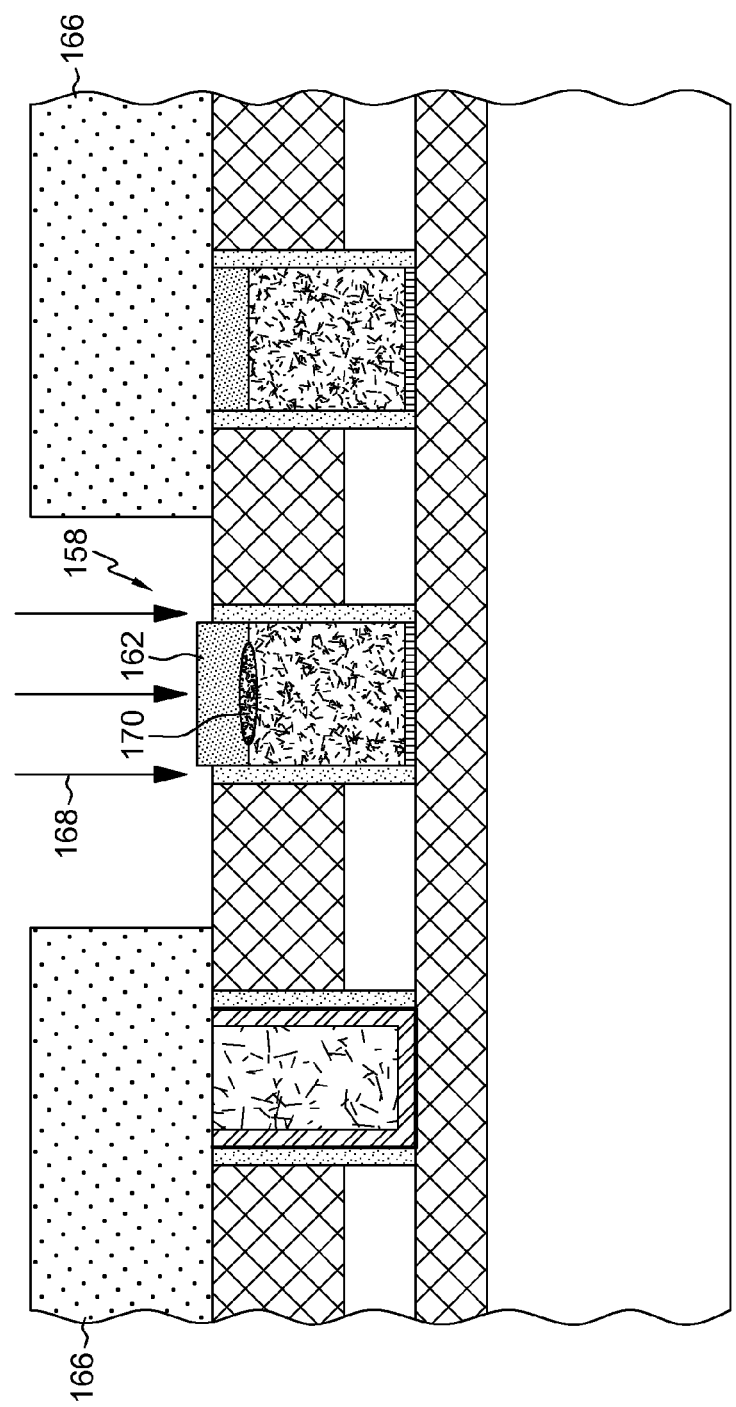
FIG. 11 depicts one example of the structure of FIG. 10 after forming a protective layer over the device(s) and one resistor, and implanting dopant(s) in the other resistor just below the silicide, in accordance with one or more aspects of the present invention.

FIG. 11 depicts one example of the structure of FIG. 10 after forming a protective layer 166 (e.g., photoresist) over device 156 and resistor 160, and implanting 168 one or more dopants 170 just below the silicide 162 of resistor 158, in accordance with one or more aspects of the present invention. In one example, multiple dopants may be selectively implanted for segregation purposes, e.g., a combination of boron, phosphorus and arsenic. In another example, the dopant may include platinum, which can form a different face for nickel silicide (NiSi) and $NiSi_2$, at the same annealing temperature.

Figure 12:
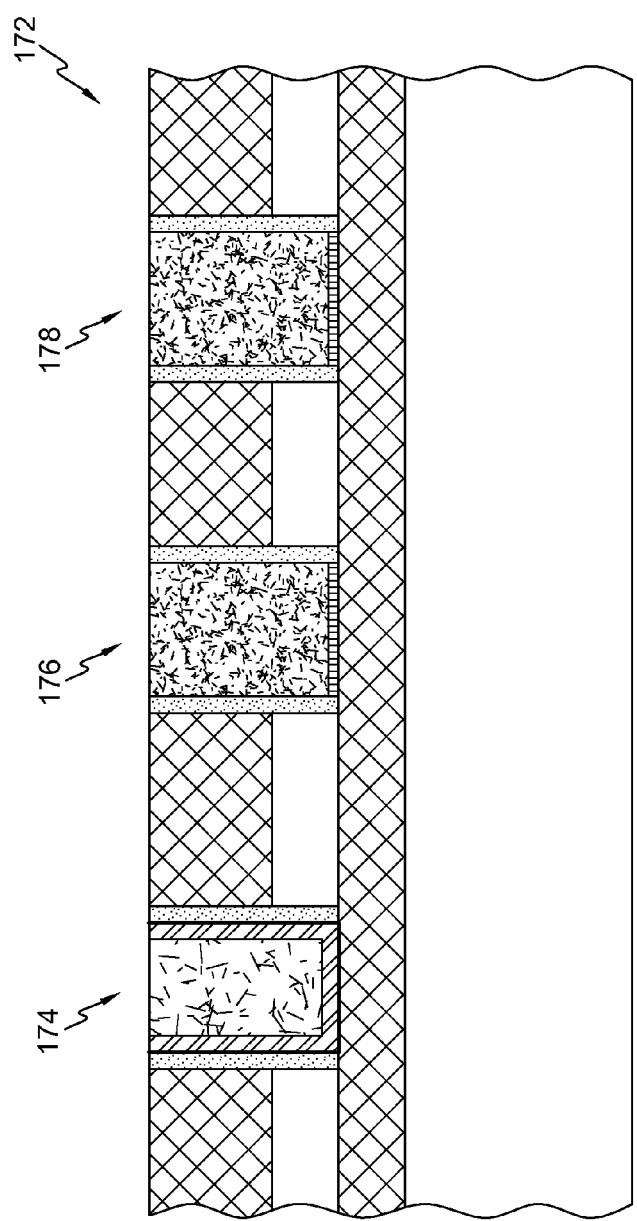
FIG. 12 is another example of a resistor structure including a semiconductor device and two dummy gates, in accordance with one or more aspects of the present invention.

FIG. 12 is another example of a resistor structure 172 including a semiconductor device 174 and two dummy gate structures 176 and 178, in accordance with one or more aspects of the present invention.

Figure 13:
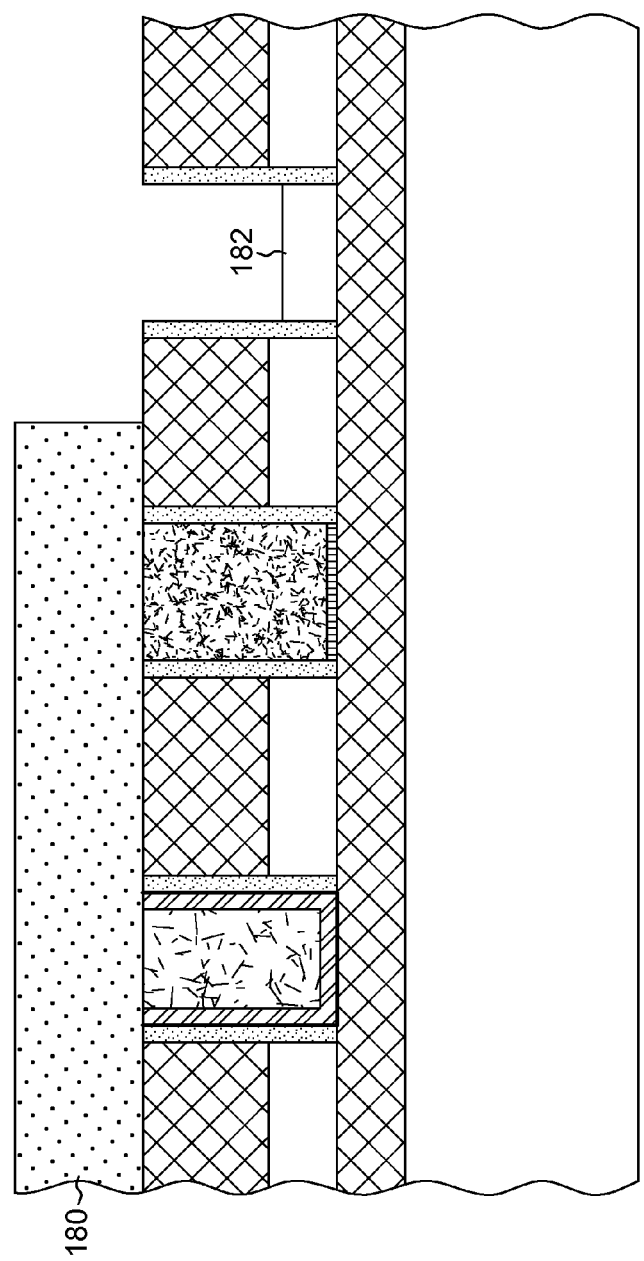
FIG. 13 depicts one example of the structure of FIG. 12 after forming a protective layer over the device and dummy gate (see FIG. 12), then removing the dummy gate material and underlying dielectric in one gate structure, exposing the fin, in accordance with one or more aspects of the present invention.

FIG. 13 depicts one example of the structure of FIG. 12 after forming a protective layer 180 (e.g., photoresist) over device 174 and dummy gate structure 176 (see FIG. 12), then removing the dummy gate material (178, FIG. 12), for example, polysilicon or amorphous silicon, and underlying dielectric layer, exposing fin 182, in accordance with one or more aspects of the present invention.

Figure 14:
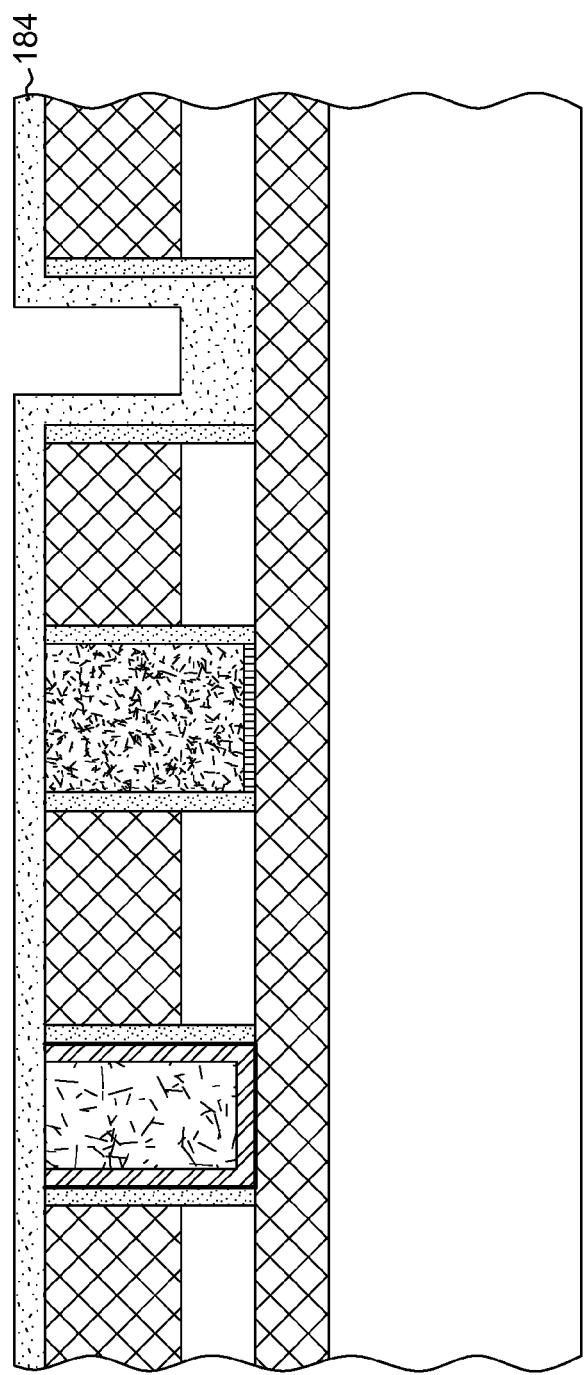
FIG. 14 depicts one example of the structure of FIG. 13 after removing the protective layer and forming a thin conformable layer of silicidable metal over the structure, in accordance with one or more aspects of the present invention.

FIG. 14 depicts one example of the structure of FIG. 13 after removing the protective layer (180, FIG. 13) and forming a thin (e.g., about 1 nm to about 10 nm) conformable layer of silicidable metal (e.g., nickel, cobalt or titanium) 184 over the structure, in accordance with one or more aspects of the present invention.

Figure 15:
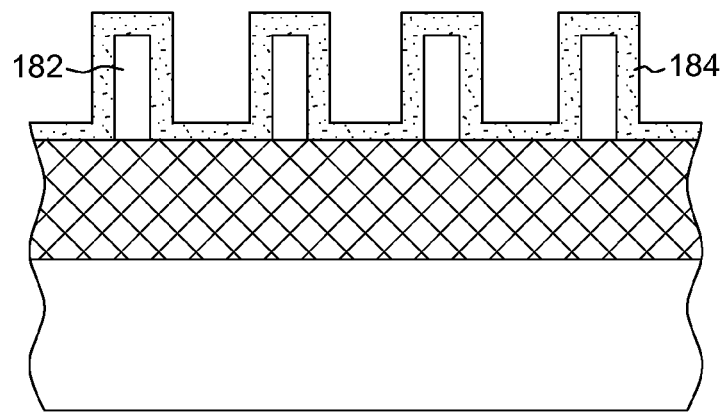
FIG. 15 is a cross-sectional view of the structure of FIG. 14, the view taken through a fin (see FIG. 13) with three other fins and a conformable silicidable metal layer thereover, in accordance with one or more aspects of the present invention.

FIG. 15 is a cross-sectional view of the structure of FIG. 14, the view taken through fin 182 (see FIG. 13) showing three other fins and conformable silicidable metal layer 184 thereover, in accordance with one or more aspects of the present invention.

Figure 16:
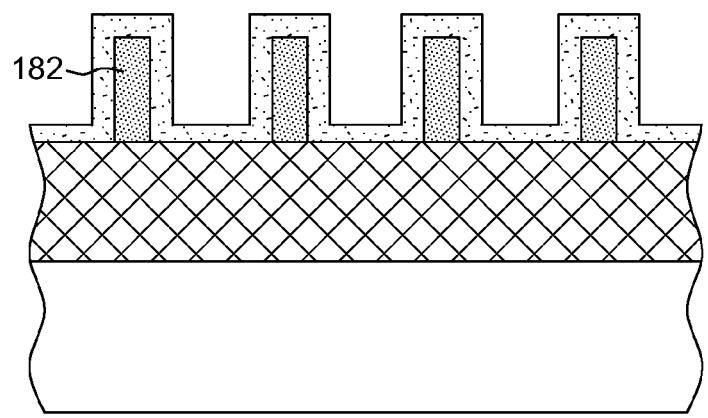
FIG. 16 depicts one example of the structure of FIG. 15 after annealing to silicide the fins, in accordance with one or more aspects of the present invention.

FIG. 16 depicts one example of the structure of FIG. 15 after annealing to silicide the fins (e.g., silicided fin 182), in accordance with one or more aspects of the present invention.

Figure 17:
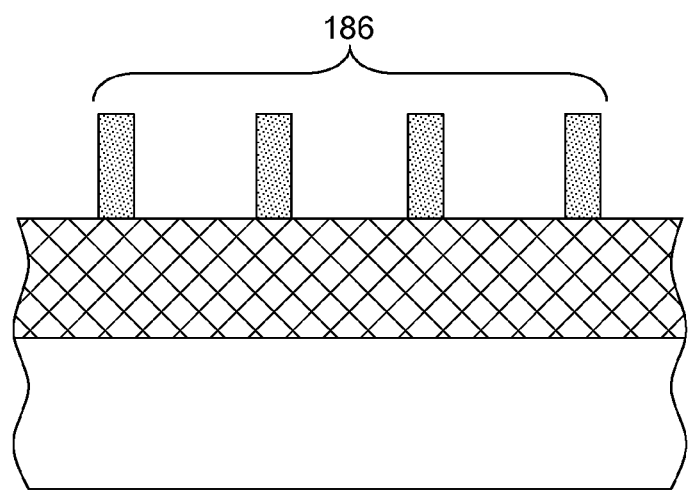
FIG. 17 depicts one example of the structure of FIG. 16 after removing the unreacted metal layer, revealing the silicided fins, in accordance with one or more aspects of the present invention.

FIG. 17 depicts one example of the structure of FIG. 16 after removing the unreacted metal layer (184, FIG. 15), revealing the silicided fins 186, in accordance with one or more aspects of the present invention.

Figure 18:
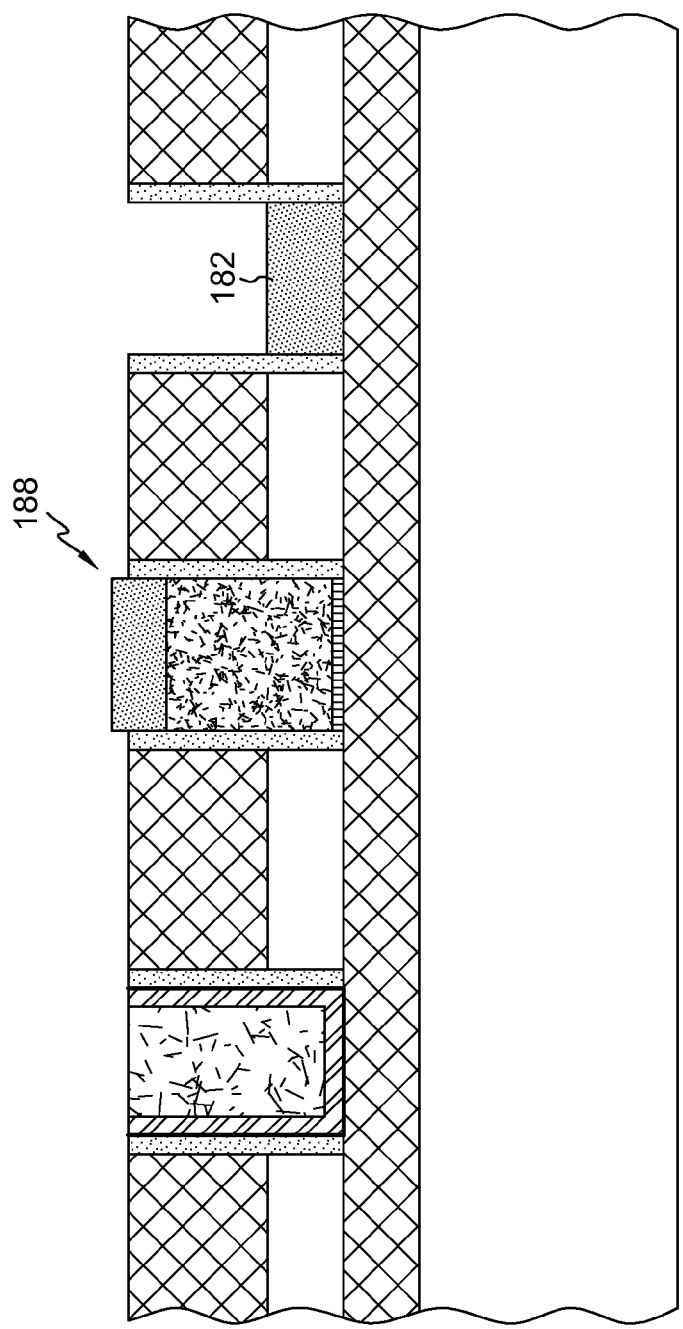
FIG. 18 depicts one example of the structure of FIG. 17 taken with the view of FIG. 14, showing a silicided fin (now resistor) and a resistor, in accordance with one or more aspects of the present invention.

FIG. 18 depicts one example of the structure of FIG. 17 taken with the view of FIG. 14, showing silicided fin (now resistor) 182 and resistor 188, in accordance with one or more aspects of the present invention.

Figure 19:
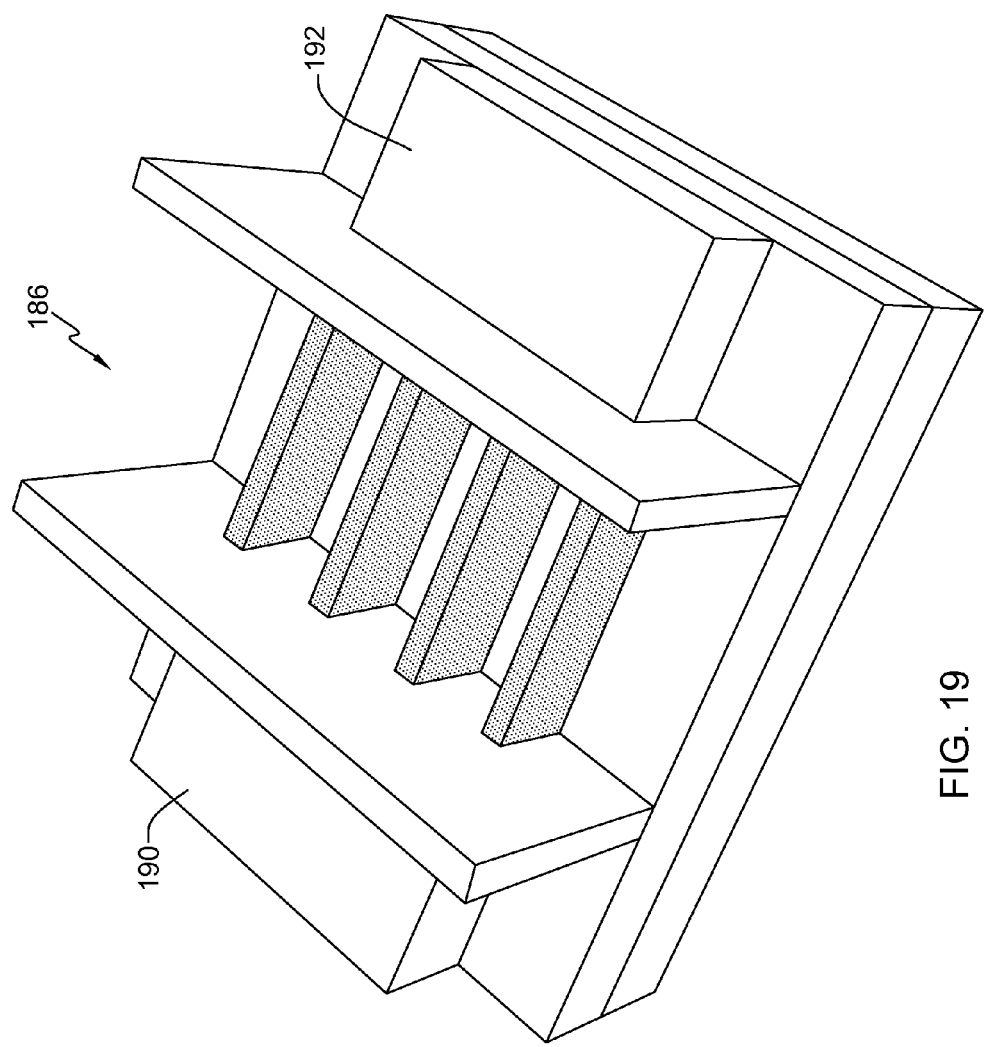
FIG. 19 is a three-dimensional view of the structure of the FIG. 18, showing the silicided fins, the source and drain acting as electrodes for the silicided fins (resistors), in accordance with one or more aspects of the present invention.

FIG. 19 is a three-dimensional view of the structure of the FIG. 18, showing the silicided fins 186, a common source 190 and a common drain 192 acting as electrodes for the silicided fins (now resistors), in accordance with one or more aspects of the present invention.

Figure 20:
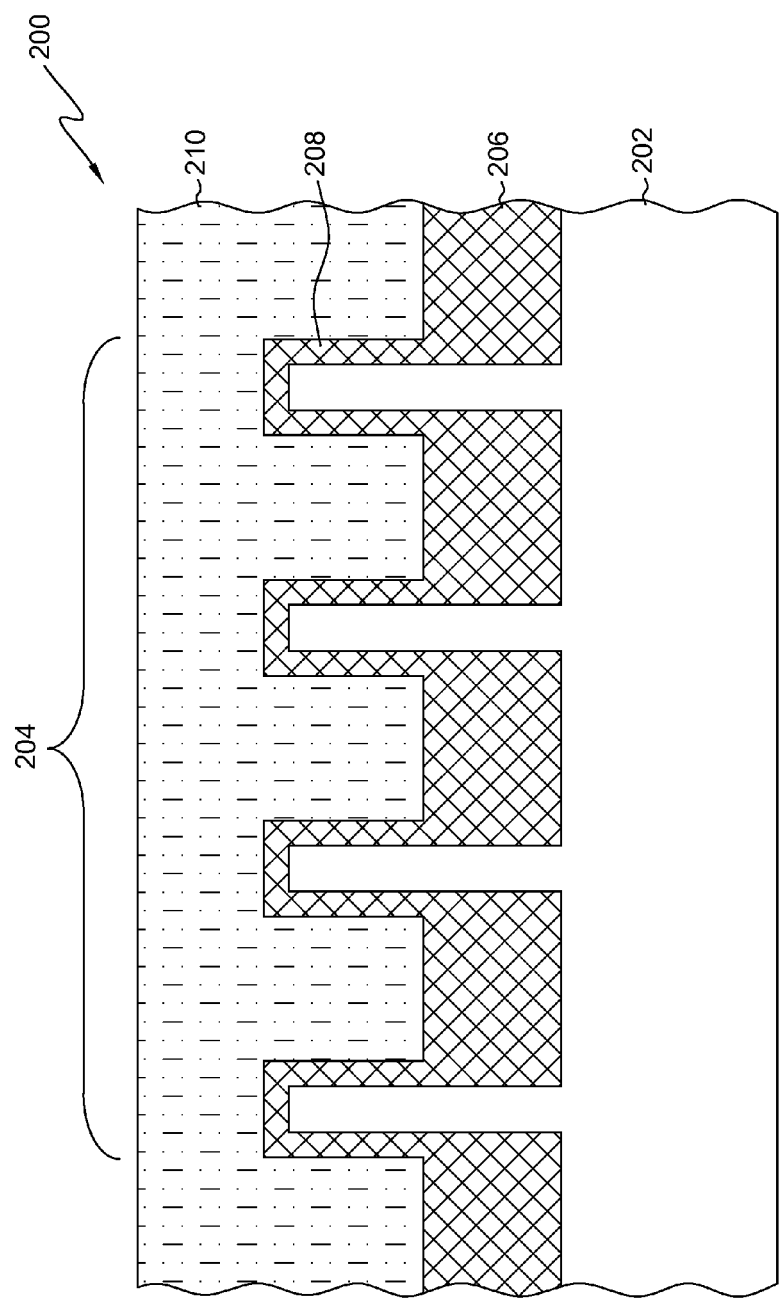
FIG. 20 is a cross-sectional view, taken through a dummy gate, of one example of a starting semiconductor structure showing another example of forming a resistor during a RMG process, the starting structure including a semiconductor substrate, a set of fins coupled to the substrate, a layer of isolation material surrounding bottom portions of the fins, the isolation material also forming a thin conformal layer on the fins, dummy gate material surrounding top portions of the fins, in accordance with one or more aspects of the present invention.

FIG. 20 is a cross-sectional view, taken through a dummy gate, of one example of a starting semiconductor structure 200 showing another example of forming a resistor during a RMG process, the starting structure including a semiconductor substrate 202, a set of fins 204 coupled to the substrate, a layer 206 of isolation material surrounding bottom portions of the fins, the isolation material also forming a relatively thin conformal layer 208 on the fins, dummy gate material 210 (e.g., polysilicon or amorphous silicon) surrounding a common top portion of the fins, in accordance with one or more aspects of the present invention. As with the prior examples, a lithographic/masking process is used to protect resistor areas, then RMG formation for any transistors. After gate electrodes of the transistors are filled, a planarization process (e.g., chemical mechanical polish) may be performed. In addition, the resistor fabrication flow described can begin either pre- or post-RMG. For post-RMG, the gate metal would first be replaced with dummy gate material.

Figure 21:
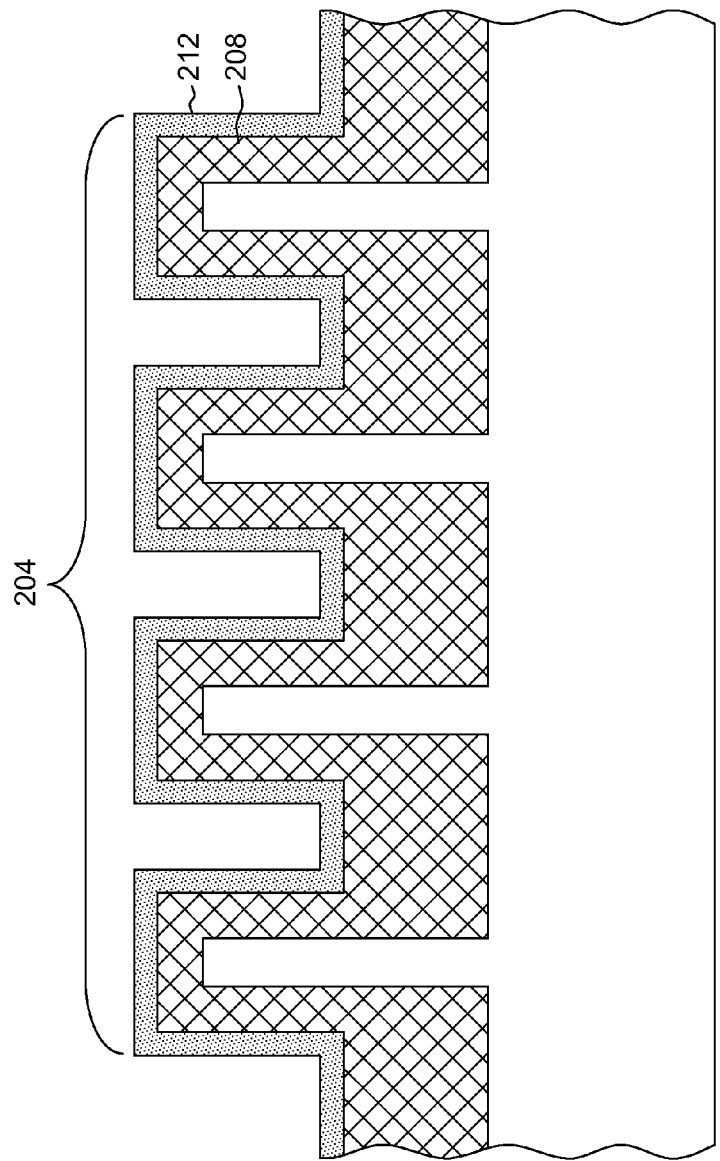
FIG. 21 depicts one example of the structure of FIG. 20 after adding more isolation material around the fins, removing the gate structure, including the dummy gate material, and forming a conformal layer of silicide (e.g., directly using atomic layer deposition) resulting in a resistor, in accordance with one or more aspects of the present invention.

FIG. 21 depicts one example of the structure of FIG. 20 after adding more isolation material 208 around the fins 204, removing the dummy gate material (210, FIG. 20), and forming a conformal layer of silicide 212 (e.g., directly, using atomic layer deposition) resulting in a resistor, in accordance with one or more aspects of the present invention.

Figure 22:
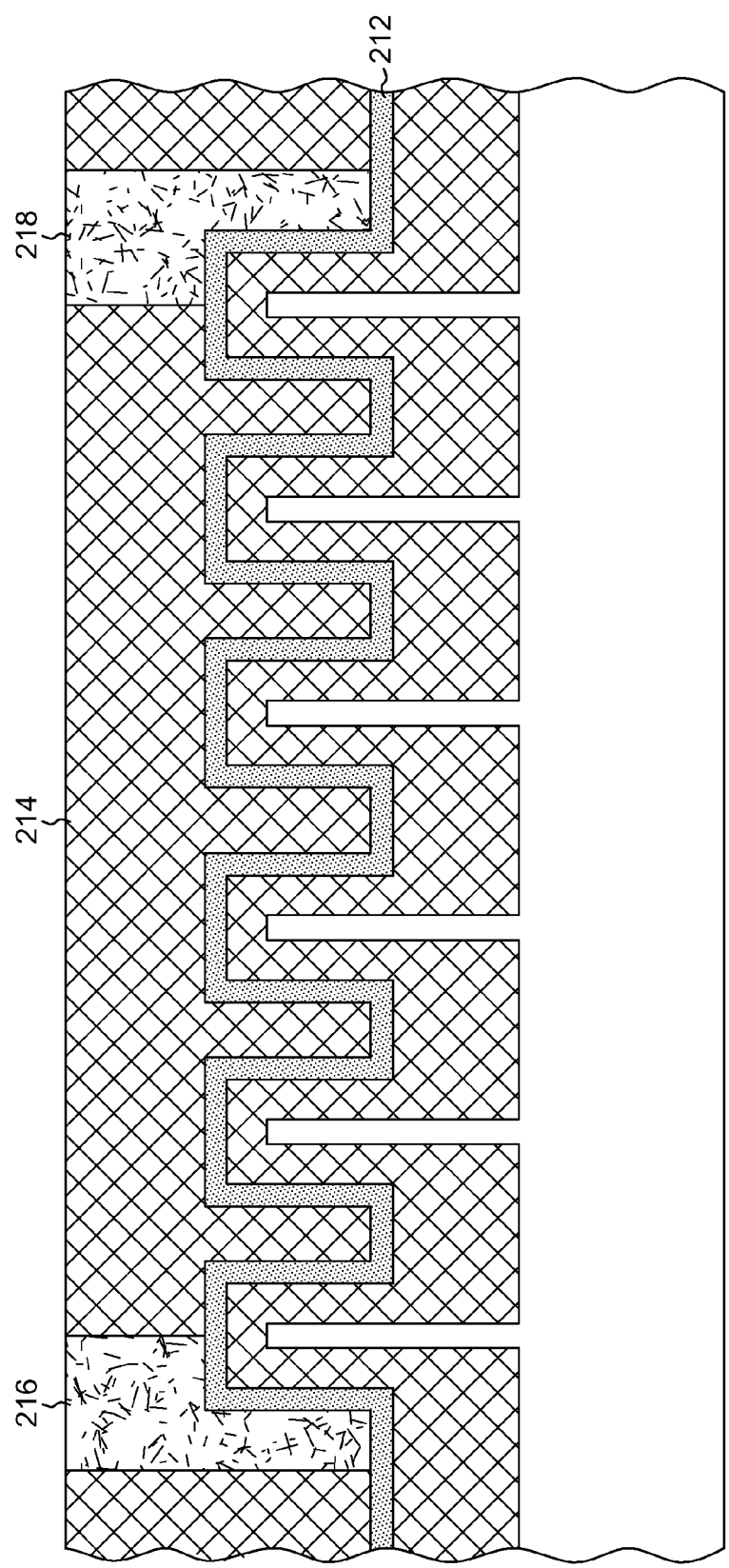
FIG. 22 depicts one example of the structure of FIG. 21 after forming a blanket layer of dielectric material and forming contacts to the resistor, in accordance with one or more aspects of the present invention.

FIG. 22 depicts one example of the structure of FIG. 21 after forming a blanket layer 214 of dielectric material (e.g., an oxide) and forming contacts 216 and 218 to resistor 212, in accordance with one or more aspects of the present invention.

In a first aspect, disclosed above is a method. The method includes providing, as part of a replacement gate process, a starting semiconductor structure, the structure including a semiconductor substrate, fins coupled to the substrate, and gate region(s) encompassing a portion of at least some of the fins, the gate region(s) being defined by a pair of spacers, and forming resistor(s) in one or more of the gate region(s), the one or more of the gate region(s) being filled with undoped dummy gate material.

In one example, the forming includes forming a layer of metal over the dummy gate material.

In one example, forming the resistor(s) may further include, for example, annealing to transform the layer of metal and a top portion of the undoped dummy gate material into silicide. In one example, the one or more of the gate region(s) may include, for example, at least two gate regions, and each of the gate regions has a different silicide thickness.

In one example, where the different silicide thicknesses are present, the method may further include, for example, implanting dopant(s) at a bottom of the resistor(s).

In one example, where the annealing is performed, the layer of metal may include, for example, one of nickel, cobalt and titanium. In another example, the layer of metal may have, for example, a thickness of about 1 nm to about 10 nm.

In one example, the method of the first aspect may further include, for example, after forming the resistor(s), forming a blanket dielectric layer over the structure and forming a contact to the resistor in the blanket dielectric layer.

In one example, the method of the first aspect may further include, for example, co-fabricating FinFET(s) with the resistor(s).

In one example, the gate region(s) in the method of the first aspect may include, for example, multiple gate regions, at least one of the multiple gate regions being unfilled with exposed fin(s).

In one example, where multiple gates are present, forming the resistor(s) may include, for example, forming a blanket conformal layer over the structure, and annealing the structure to form a layer of silicide at a top of the at least one of the multiple gate regions and transforming a top portion of the exposed fin(s) into silicide.

In one example, forming the resistor(s) in the method of the first aspect may include, for example, forming a conformal layer of dielectric material over the fins in the gate region(s), and forming a conformal layer of silicide over the conformal layer of dielectric material. In one example, the method may further include, for example, forming a blanket dielectric layer over the structure, and forming contacts to the conformal layer of silicide.

In a second aspect, disclosed above is a semiconductor structure. The structure includes, for example, a semiconductor substrate, multiple fins coupled to the substrate and surrounded at a bottom portion thereof by isolation material, at least one gate region surrounding a portion of one or more of the fin(s), and resistor(s) situated in at least one gate region, wherein the at least one gate region is filled with undoped dummy gate material.

In one example, the resistor(s) may further include, for example, silicide at a top portion thereof. In one example, the silicide may include, for example, one of nickel, cobalt and titanium and may have, for example, a thickness of from about 1 nm to about 10 nm.

In one example, the resistor(s) may include, for example, multiple resistors, and the silicide of each resistor may have, for example, different thicknesses.

In one example, where the resistor(s) include dummy gate material and top silicide, the semiconductor structure may further include, for example, one or more impurities at a bottom of one or more of the resistor(s).

In one example, the resistor(s) in the semiconductor structure of the second aspect may include, for example, one or more silicided fin(s).

In one example, the resistor(s) in the semiconductor structure of the second aspect may include, for example, a conformal layer of silicide surrounding at least one of the fins.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing, as part of a replacement gate process, a starting semiconductor structure, the structure comprising a semiconductor substrate, a plurality of fins coupled to the substrate, and at least one gate region encompassing a portion of at least some of the plurality of fins, the at least one gate region being defined by a pair of spacers; and
forming at least one resistor in one or more of the at least one gate region, the one or more of the at least one gate region being filled with undoped dummy gate material.

2. The method of claim 1, wherein the forming comprises forming a layer of metal over the dummy gate material.

3. The method of claim 2, wherein forming the at least one resistor further comprises annealing to transform the layer of metal and a top portion of the undoped dummy gate material into silicide.

4. The method of claim 3, wherein the one or more of the at least one gate region comprises at least two gate regions, and wherein each of the at least two gate regions has a different silicide thickness.

5. The method of claim 3, further comprising implanting one or more dopants at a bottom of the at least one resistor.

6. The method of claim 2, wherein the layer of metal comprises one of nickel, cobalt and titanium.

7. The method of claim 2, wherein the layer of metal has a thickness of about 1 nm to about 10 nm.

8. The method of claim 1, further comprising, after forming the at least one resistor, forming a blanket dielectric layer over the structure and forming a contact to the resistor in the blanket dielectric layer.

9. The method of claim 1, further comprising co-fabricating at least one FinFET with the at least one resistor.

10. The method of claim 1, wherein the at least one gate region comprises at least two gate regions, at least one of the at least two gate regions being unfilled with at least one exposed fin.

11. The method of claim 10, wherein forming the at least one resistor comprises:
forming a blanket conformal layer over the structure; and
annealing the structure to form a layer of silicide at a top of the at least one of the at least two gate regions and transforming a top portion of the at least one exposed fin into silicide.

12. The method of claim 1, wherein forming the at least one resistor comprises:
forming a conformal layer of dielectric material over the plurality of fins in the one or more of the at least one gate region; and
forming a conformal layer of silicide over the conformal layer of dielectric material.

13. The method of claim 12, further comprising:
forming a blanket dielectric layer over the structure; and
forming contacts to the conformal layer of silicide.

14. A semiconductor structure, comprising:
a semiconductor substrate;
a plurality of fins coupled to the substrate and surrounded at a bottom portion thereof by isolation material;
at least one gate region surrounding a portion of at least one of the plurality of fins; and
at least one resistor situated in one or more of the at least one gate region, wherein the one or more of the at least one gate region is filled with undoped dummy gate material.

15. The semiconductor structure of claim 14, wherein the at least one resistor further comprises silicide at a top portion thereof.

16. The semiconductor structure of claim 15, wherein the silicide comprises one of nickel, cobalt and titanium and has a thickness of from about 1 nm to about 10 nm.

17. The semiconductor structure of claim 15, wherein the at least one resistor comprises at least two resistors, and wherein the silicide of the at least two resistors have different thicknesses.

18. The semiconductor structure of claim 15, further comprising one or more impurities at a bottom of at least one of the at least one resistor.

19. The semiconductor structure of claim 14, wherein the at least one resistor comprises at least one silicided fin of the plurality of fins.

20. The semiconductor structure of claim 14, wherein the at least one resistor comprises a conformal layer of silicide surrounding at least one fin of the plurality of fins.

* * * * *